(12) United States Patent
Schroder et al.

(10) Patent No.: US 10,150,230 B2
(45) Date of Patent: Dec. 11, 2018

(54) METHOD FOR DRYING THIN FILMS IN AN ENERGY EFFICIENT MANNER

(75) Inventors: Kurt A. Schroder, Coupland, TX (US);
Ian M. Rawson, Austin, TX (US);
Steven C. McCool, Austin, TX (US);
Andrew E. Edd, Austin, TX (US);
Ronald I. Dass, Austin, TX (US)

(73) Assignee: NCC NANO, LLC, Dallas, TX (US)

( * ) Notice: Subject to any disclaimer, the term of this patent is extended or adjusted under 35 U.S.C. 154(b) by 1618 days.

(21) Appl. No.: 13/432,399

(22) Filed: Mar. 28, 2012

(65) Prior Publication Data
US 2012/0255192 A1 Oct. 11, 2012

Related U.S. Application Data

(63) Continuation-in-part of application No. 13/082,469, filed on Apr. 8, 2011, now Pat. No. 8,907,258.

(51) Int. Cl.
| | | |
|---|---|---|
| *H05B 6/10* | (2006.01) | |
| *B29C 35/08* | (2006.01) | |
| *B29B 13/02* | (2006.01) | |
| *B29B 13/06* | (2006.01) | |
| *B29B 13/08* | (2006.01) | |

(Continued)

(52) U.S. Cl.
CPC ........ *B29C 35/0805* (2013.01); *B29B 13/023* (2013.01); *B29B 13/06* (2013.01); *B29B 13/08* (2013.01); *B29C 35/10* (2013.01); *H05K 3/1283* (2013.01)

(58) Field of Classification Search
CPC ...... B29G 13/023; B29G 13/06; B29G 13/08; B29C 35/0805; B29C 35/10

USPC ...... 219/121.64, 121.67, 121.69, 121.8, 390, 219/653; 438/149, 151, 458, 629
See application file for complete search history.

(56) References Cited

U.S. PATENT DOCUMENTS

| 5,194,723 A | 3/1993 | Cates et al. |
| 5,858,819 A * | 1/1999 | Miyasaka ............... 438/149 |

(Continued)

FOREIGN PATENT DOCUMENTS

| WO | 2006015328 A2 | 2/2006 |
| WO | WO 2006071419 A2 * | 7/2006 |

OTHER PUBLICATIONS

Schwertz. K. Useful Estimations and Rules of Thumb for Optomechanics. Thesis. The University of Arizona. May 7, 2010 [retrieved on Jul. 4, 2012]. Retrieved from the Internet <http://www.optimaxsi.com/PDFs/RulesOfThumbOptomechanics.pdf> entire document.

(Continued)

*Primary Examiner* — Thien S Tran
(74) *Attorney, Agent, or Firm* — Russell Ng PLLC; Antony P. Ng (57) ABSTRACT

A method for drying a thin film stack having a thin film located on a substrate is disclosed. The thin film stack is conveyed past a flashlamp during which the thin film stack is irradiated with a composite light pulse from the flashlamp. The composite light pulse is composed of multiple micropulses. The time duration of the composite light pulse is shorter than a total thermal equilibration time of the thin film stack. In addition, when the thin film stack is being conveyed past the flashlamp, the thin film stack should move less than 10% of the length of the irradiating area in the conveyance direction during the delivery of the composite light pulse.

7 Claims, 4 Drawing Sheets

(51) Int. Cl.
*B29C 35/10* (2006.01)
*H05K 3/12* (2006.01)

(56) References Cited

U.S. PATENT DOCUMENTS

| | | | |
|---|---|---|---|
| 6,660,572 | B2 | 12/2003 | Miyasaka |
| 7,317,870 | B2 | 1/2008 | Timans et al. |
| 2005/0236395 | A1* | 10/2005 | Timans et al. ................ 219/497 |
| 2006/0091125 | A1* | 5/2006 | Li et al. .................. 219/121.69 |
| 2006/0174508 | A1* | 8/2006 | Govek et al. .................. 34/265 |
| 2006/0216927 | A1 | 9/2006 | Cordingley |
| 2008/0020304 | A1* | 1/2008 | Schroder et al. ............... 430/39 |
| 2009/0305483 | A1* | 12/2009 | Tanaka .......................... 438/458 |
| 2010/0007285 | A1* | 1/2010 | Schroder et al. ......... 315/241 P |

OTHER PUBLICATIONS

PCT/US2012/030845, File Date: Mar. 28, 2012, International Search Report and Written Opinion dated Jul. 11, 2012.

* cited by examiner

METHOD FOR DRYING THIN FILMS IN AN ENERGY EFFICIENT MANNER

PRIORITY CLAIM

The present application is a continuation-in-part of U.S. patent application Ser. No. 13/082,469, filed on Apr. 8, 2011, now U.S. Pat. No. 8,907,258 the contents of which are incorporated herein by reference.

BACKGROUND OF THE INVENTION

1. Technical Field

The present invention relates to thermally processing thin films in general, and, in particular, to a method for drying thin films by using light pulses from a flashlamp.

2. Description of Related Art

When it comes to choosing substrates for supporting thin films, it is generally more preferable to employ inexpensive substrates, such as polyethylene terephthalate (PET), polycarbonate, cellulose, etc., over expensive substrates, such as silicones, fluorocarbons, ceramic, glass, etc., due to cost reasons. However, inexpensive substrates tend to have lower maximum working temperatures than their expensive counterparts such that only relatively low temperatures can be utilized to dry thin films located on inexpensive substrates.

According to the Arrhenius equation, thermally driven processes, such as drying (i.e., driving off solvent), particle sintering, densification, chemical reaction initiation, chemical reaction modulation, phase transformation, grain growth, annealing, heat treating, etc., are related to the processing temperature in an exponential fashion. Hence, a small reduction in the drying temperature will require a significantly longer drying time and more energy, which translates to a more costly drying operation.

Consequently, it would be desirable to provide an improved process for thermally processing thin films located on inexpensive substrates without extending the processing time.

SUMMARY OF THE INVENTION

In accordance with a preferred embodiment of the present invention, a thin film stack is thermally processed by conveying the thin film stack past a flashlamp during which the thin film stack is irradiated with a composite light pulse from the flashlamp. The composite light pulse is composed of multiple micropulses. The time duration of the composite light pulse is shorter than a total thermal equilibration time of the thin film stack. In addition, when the thin film stack is being conveyed past the flashlamp, the thin film stack should move less than 10% of the length of the irradiating area in the conveyance direction during the delivery of the composite light pulse.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 2b is a graph showing the temperature of a substrate versus time after the substrate has been irradiated by the single light pulse from FIG. 2a;

FIG. 2c is a graph showing the temperature of a substrate versus time after the substrate has been irradiated by the composite light pulse from FIG. 2a;

DETAILED DESCRIPTION OF A PREFERRED EMBODIMENT

A. Thermal Equilibration Time of a Thin Film Stack

The thermal equilibration time $\tau$ of a layer of material is calculated by:

$$\tau = \frac{c\rho x^2}{4\kappa}$$

where c=specific heat of the material
$\rho$=mass density of the material
x=thickness of the material
$\kappa$=thermal conductivity of the material The total thermal equilibration time $\tau_{stack}$ for a thin film stack having multiple layers of different materials with different thicknesses can be calculated by:

$$\tau_{stack} = (\sqrt{\tau_1} + \sqrt{\tau_2} + \sqrt{\tau_3} \ldots \sqrt{\tau_i})^2$$

where $\tau_1, \tau_2, \tau_3$, etc. are the thermal equilibrium time of each of the individual layers, respectively, of the thin film stack.

Figure 1:
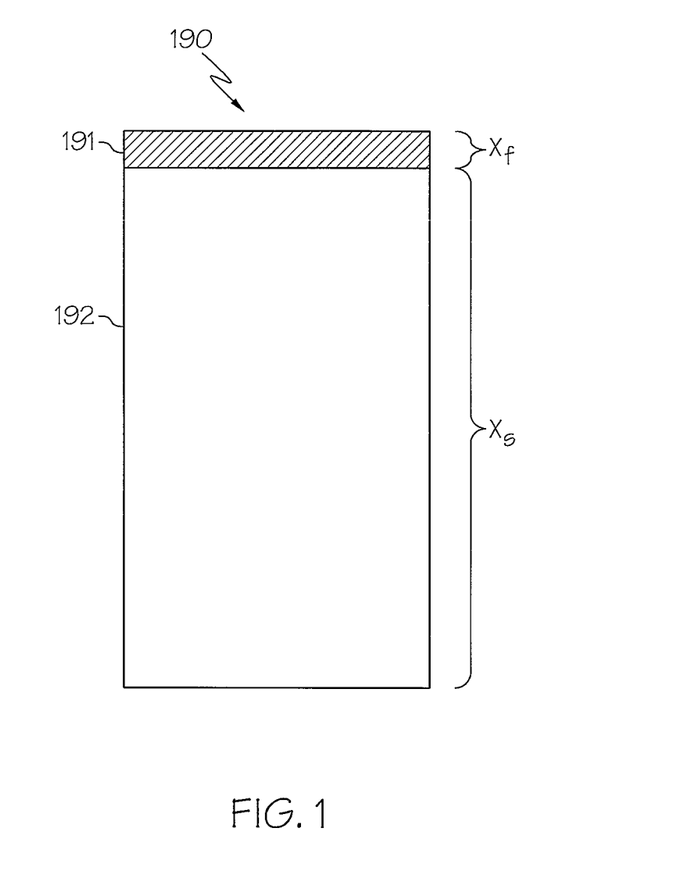
FIG. 1 is a diagram of a thin film stack.

Although a thin film stack may include multiple layers of different materials, in practice, a thin film stack is usually comprised of a layer of thin film on top of a comparatively thicker substrate for supporting the thin film. In such a case, the thermal equilibration time of a thin film stack is often dominated by the substrate. For example, for a thin film stack 190 composed of a thin film 191 located on top of a substrate 192, as shown in FIG. 1, wherein thin film 191 has a thickness $x_f$ and a thermal equilibration time $\tau_f$, and substrate 192 has a thickness $x_s$ and a thermal equilibration time $\tau_s$, the total thermal equilibration time $\tau_{stack}$ of thin film stack 190 is simply the thermal equilibration time $\tau_s$ of substrate 192 when $x_s \gg x_f$.

The above-mentioned principle can be illustrated with a practical example. When substrate 192 is made of polyethylene terephathalate (PET) with $c_s$=730 J/kg-K, $\rho_s$=1.4 g/cm$^3$, $x_s$=150 micron and $\kappa_s$=0.24 W/m-K, and thin film 191 is made of silver with $c_f$=235 J/kg-K, $\rho_f$=10.5 g/cm$^3$, $x_f$=1 micron and $\kappa_f$=420 W/m-K, the thermal equilibration time of substrate 192 ($\tau_s$) and thin film 191 ($\tau_f$) are 24 ms and 1.5×10$^{-6}$ ms, respectively. Thus, the thermal equilibration time of thin film stack 191 is nearly indistinguishable from that of substrate 192 alone when $x_s \gg x_f$.

B. Thermal Processing of a Thin Film Stack

When thermally processing thin film 191 on substrate 192, entire film stack 190 can be heated to a maximum working temperature of substrate 192 to minimize the thermal processing time. Importantly, it is even possible to heat thin film 191 on substrate 192 to a temperature far beyond the maximum working temperature of substrate 192 without damaging substrate 192 when substrate 192 is heated quickly and cooled quickly.

Figure 2A:
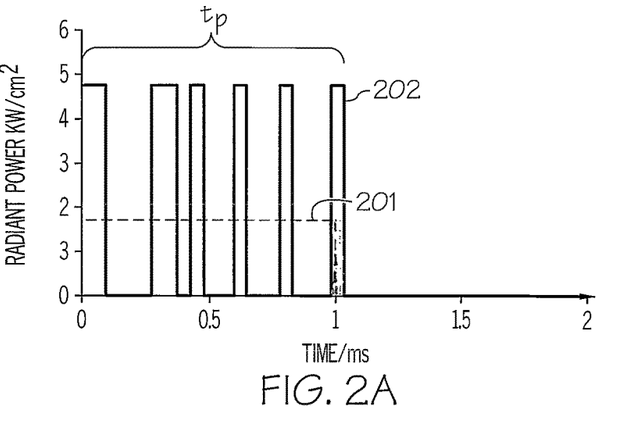
FIG. 2a shows the intensity and pulse length of a single light pulse and a composite light pulse, each can be used for heating the thin film stack from FIG. 1.
Figure 2B:
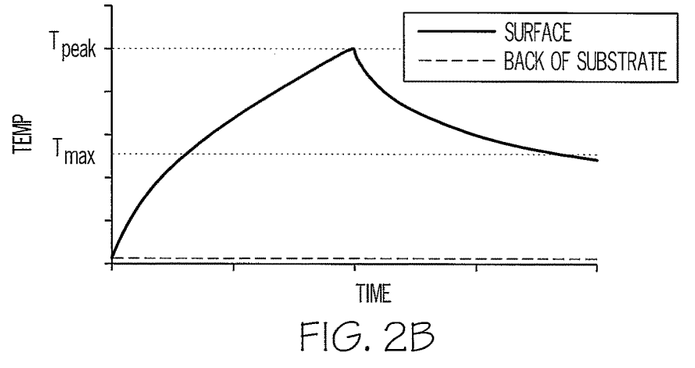

In order to achieve a very short heating time along with a very fast cooling rate for substrate 192, a single light pulse 201 with a duration $t_p$, as depicted in FIG. 2a, can be used to heat both thin film 191 and substrate 192 to a temperature $T_{peak}$. Temperature $T_{peak}$ can be higher than the maximum working temperature $T_{max}$ of substrate 192, as shown in FIG. 2b, because the side of substrate 192 adjacent to thin film 191 is only at temperature $T_{peak}$ for a very short time such that substrate 192 does not have an opportunity to change its properties significantly. In addition, thin film 191 is rapidly cooled via conduction to substrate 192.

In conjunction with the physical properties and dimensions of thin film 191 and substrate 192, both the heating time and cooling rate of thin film stack 190 are determined by the thermal profile of the light pulse (i.e., the shape of the light pulse).

In accordance with a preferred embodiment of the present invention, light pulse 201 of FIG. 2a can be delivered to substrate 192 in the form of a composite light pulse 202. Composite light pulse 202 is composed of multiple light pulses. When composite light pulse 202 having a correct thermal profile is utilized, substrate 192 can be heated to a temperature far beyond its maximum working temperature in order to achieve the shortest drying time. When drying thin film stack 190, the pulse length of composite light pulse 202 is preferably shorter than the thermal equilibration time $\tau_{stack}$ of thin film stack 190.

As shown in FIG. 2a, composite light pulse 202 includes multiple micropulses to allow the temperature profile in a thin film stack, such as thin film stack 190 from FIG. 1, to be customized for an optimal cure. In its simplest form, composite light pulse 202 includes uniform micropulses. In this case, composite light pulse 202 can be shaped by six different parameters: i. intensity (voltage), ii. composite pulse length, iii. average number of composite pulses that impinge on a substrate in any given area on a thin film stack, iv. pulse repetition frequency, v. number of micropulses, and vi. duty cycle of micropulses. When the non-uniform micropulses are utilized, the pulse length and delay of each individual micropulse can be specified.

Figure 2C:
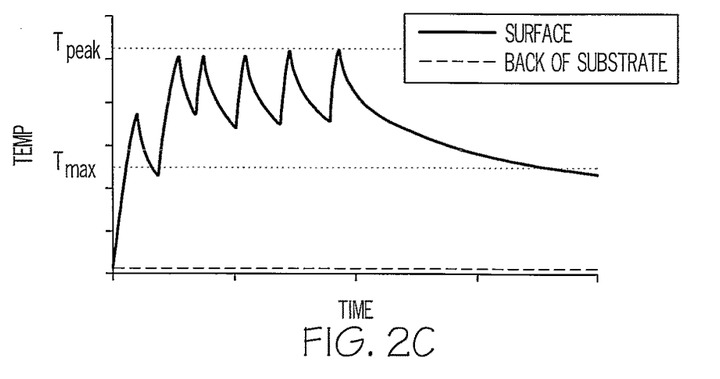

With substrate 192 having a maximum working temperature $T_{max}$ thin film 191 located on substrate 192 can be heated by composite light pulse 202 from FIG. 2a to a temperature $T_{peak}$ when the heating time is very short and the cooling rate is very fast. As shown in FIG. 2c, when the temperature at the surface of substrate 192 briefly reaches $T_{peak}$, and the temperature at the surface of substrate 192 quickly levels to less than the maximum working temperature $T_{max}$. Also, substrate 192 quickly reaches the thermal equilibrium after being heated by the composite light pulse.

The parameters of an optimal composite light pulse for processing of a thin film can be determined experimentally. First, a damage threshold on a thin film stack from a single light pulse is ascertained by selecting a pulse length that is shorter than the thermal equilibration time of the thin film stack and exposing the thin film stack to a series of single light pulses of increasing areal power density until some damage to the thin film stack is observed. The optimal thermal processing for that single light pulse length is generally the power that is slightly less than the damage threshold power. Since the damage mechanism is often thermally driven, i.e., related to the amount of energy deposited, a shorter pulse length generally has a higher areal power density threshold. Additionally, when the thin film is absorbing the light, shorter pulse lengths generally preferentially heat the thin film over the substrate that increases the energy efficiency of the process. However, in the case of a drying process or any thermal process that generates gas, the damage threshold is also related to the rate at which the gas can escape without causing a local "explosion" in the thin film stack. Thus, there is also fundamentally a maximum areal power density independent of pulse length, which means efficient thermal processing cannot be achieve by simply continuing to reduce the pulse length.

When the above-mentioned single light pulse is transformed into a burst of shorter pulses (i.e., micropulses) of the same total pulse length, the energy efficiency of a very short pulse can be realized while depositing adequate energy to process the thin film. This processing can be done at an instantaneous power (e.g., the power during a micropulse) beyond the single pulse damage threshold without damaging the thin film stack.

The optimization of a composite light pulse for thermal processing can be further improved by using a software simulation, such as SimPulse™ from NovaCentrix of Austin, Tex., to simulate the thermal response of the thin film stack due to the exposure from the composite light pulse. By inputting the thermo-physical properties of each layer in the thin film stack as well as the output from the flashlamp, the simulation software can provide the temperature at every location within the thin film stack during and after exposure to the composite pulse. When this is done, damage to the thin film stack can reveal physical mechanisms which cause damage. This allows one to design an optimal composite pulse to avoid a particular damage mechanism. For example, when the damage mechanism is a temperature limitation within the thin film stack, such as the gasification temperature of the substrate, one may process the thin film near, but not exceeding that particular temperature. Similarly, when drying a film which has multiple solvents, each solvent may boil at a particular temperature. Thus, optimal processing of that thin film may include a composite pulse with multiple constant temperature processing zones in which drying is first performed at a lower constant temperature to evaporate the more volatile solvent followed by processing at a higher constant temperature to evaporate the less volatile solvent.

Although a thin film can be processed at a significantly higher temperature than the maximum working temperature of the substrate for processing times shorter than the thermal equilibration time of the thin film stack, the temperature that the thin film stack attains after thermal equilibrium still needs to be lower than the maximum working temperature of the substrate or there will be damage. Thus, the total amount of energy that can be placed into the thin film stack cannot exceed the total energy needed to heat the thin film stack up to the maximum working temperature of the substrate. That number can be determined by calculating the total enthalpy of the thin film stack including any heat of vaporization of any solvent in the thin film.

Figure 2D:
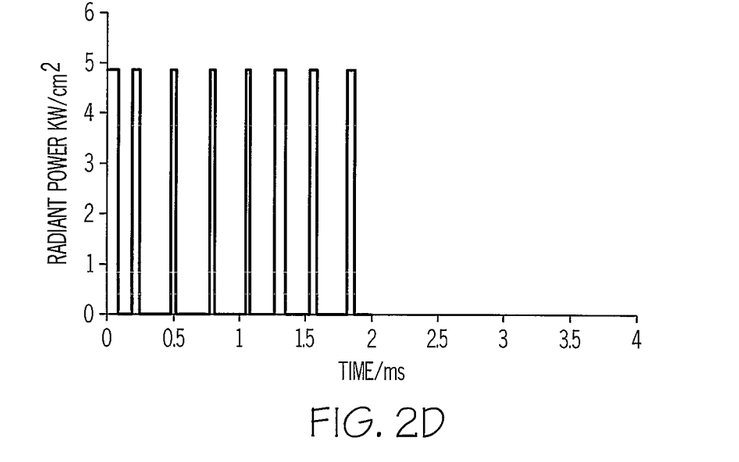
FIG. 2d is a composite light pulse capable of providing two different constant processing temperature zones.

A composite light pulse can also provide two different constant processing temperature zones on a thin film stack. For example, as shown in FIG. 2d, a composite light pulse includes multiple micropulses capable of providing two different processing temperature zones, and the timing (in µs) of the composite light pulse is listed in Table I.

TABLE I

| Turn on | Turn off |
| --- | --- |
| 0 | 87 |
| 193 | 238 |
| 473 | 508 |
| 763 | 793 |
| 1,063 | 1,093 |
| 1,276 | 1,341 |

TABLE I-continued

| Turn on | Turn off |
|---|---|
| 1,536 | 1,581 |
| 1,816 | 1,856 |

Figure 2E:
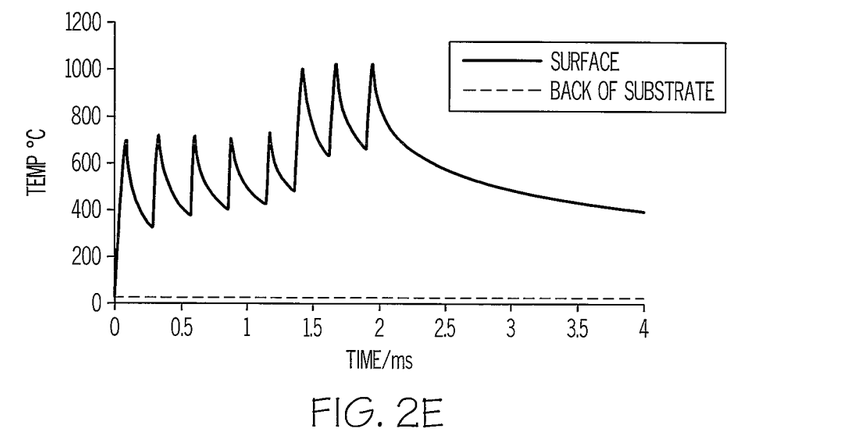
FIG. 2e is a graph showing the temperature of a substrate versus time after the substrate has been irradiated by the composite light pulse from FIG. 2d.

FIG. 2e shows the temperature of a substrate versus time after the substrate has been irradiated by the composite light pulse from FIG. 2d.

C. Apparatus for Drying a Thin Film on a Thin Film Stack

Figure 3:
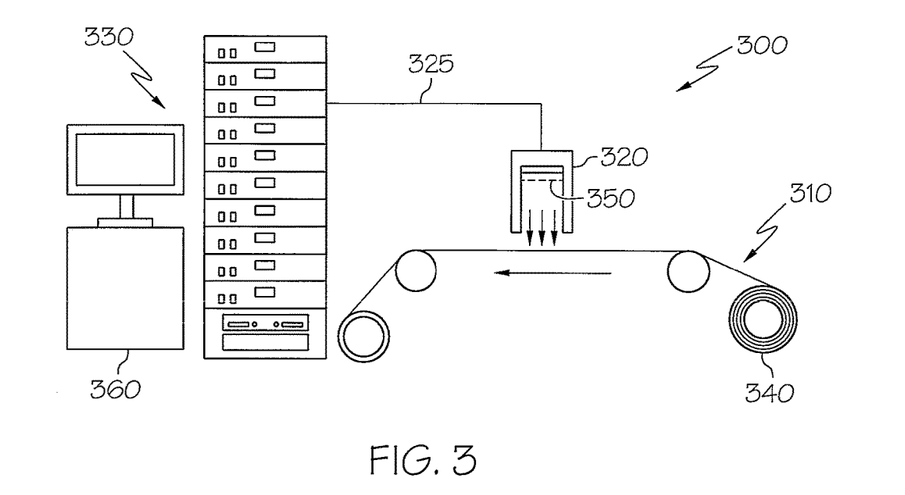
FIG. 3 is a diagram of a drying apparatus for generating the composite light pulse from FIG. 2a, in accordance with a preferred embodiment of the present invention.

Referring now to FIG. 3, there is depicted a diagram of an apparatus for drying thin films, in accordance with a preferred embodiment of the present invention. As shown, a drying apparatus 300 includes a conveyance system 310, a flashlamp controller 330 and a flashlamp head 320 having a flashlamp 350. A low inductance cable 325 is connected between flashlamp controller 330 and flashlamp head 320. Conveyance system 310 moves a thin film stack 340 past flashlamp head 320 while flashlamp controller 330 provides shaped pulses of current to flashlamp 350 using pulse width modulation (PWM) such that the shaped pulses are synchronized to the conveyance speed of thin film stack 340 on conveyance system 310. Preferably, flashlamp 350 is a sealed flash lamp filled with gases such as xenon, krypton or argon. Flashlamp 350 can also be a water-wall flashlamp, sometimes referred to as a Directed Plasma Arc (DPA) lamp.

Flashlamp controller 330 includes a control computer 360. Control computer 360 preferably includes a processing unit, input devices such as a keyboard, a mouse, a touchscreen, etc., and output devices such as a monitor, as they are well-known to those skilled in the art.

In order to pulse-width modulate a pulse train of a given duration, each individual pulse need to be relatively short in order to provide pulse shaping. Furthermore, the pulses need to be more intense than a source providing a single pulse since it is not turned on for a portion of the time. Thus, drying apparatus 300 needs to be capable of providing pulse lengths as short as 10 microseconds with peak power in excess of 100 kW/cm$^2$. In addition, the PWM frequency for pulses can be as fast as 50 kHz.

The shape of light pulses emitted from flashlamp 350 as well as the physical properties and dimensions of a thin film and substrate can affect the thermal gradient and the subsequent temperature at which the thin film can be dried while without damaging the substrate. Thus, drying apparatus 300 also includes multiple sensors (not shown) for collecting various information from different parts of drying apparatus 300 as well as the film and substrate on thin film stack 340. The collected information from various sensors and user inputs are fed back into computer control system 360 in which thermal profiles can be re-calculated. Using the re-calculated thermal profiles, flashlamp controller 330 controls the waveforms of the light being delivered to thin film stack 340 by flashlamp 350 while thin film stack 340 is being conveyed under flashlamp 350.

Figure 4:
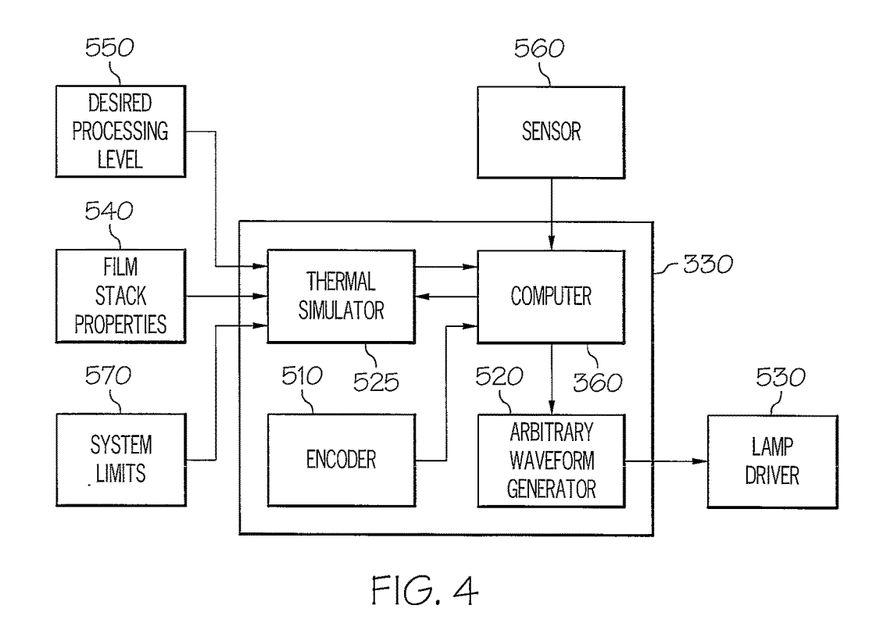
FIG. 4 is a block diagram of a flashlamp controller within the drying apparatus from FIG. 3.

With reference now to FIG. 4, there is depicted a block diagram of flashlamp controller 330. As shown, flashlamp controller 330 includes an encoder 510, an arbitrary waveform generator 520, a thermal simulator 525, and control computer 360. A user initially inputs thin film stack properties 540 and desired processing level 550 into flashlamp controller 330. After receiving inputs, such as conveyance speed, from conveyance system 310 (from FIG. 3) and additional system limits 570, encoder 510 provides trigger signals to computer that sends signals to arbitrary waveform generator 520 at appropriate times for curing thin films located on conveyance system 310. With the trigger signals, arbitrary waveform generator 520 is able to generate waveforms of various shapes and timing based on user inputs 540 and 550. Arbitrary waveform generator 520 sends waveform signals to flashlamp driver 530 that amplifies the waveform signals for driving flashlamp 350 (from FIG. 3).

The feedback information allows for continuous and real-time adjustability of parameters, such as pulse energy, pulse duration, pulse waveform, etc., when drying apparatus 300. All of the above-mentioned parameters can be altered under software and/or hardware control on a millisecond time frame with a resolution of 0.1%.

When thin film stack 340 is moving, and the flashlamp pulse frequency is synchronized to the conveyance speed, the frequency is given by:

$$f = \frac{1.67 \times S \times O}{W}$$

where
 f=flashlamp composite pulse rate [Hz]
 S=conveyance speed [m/min]
 O=overlap factor (i.e., the average number of composite pulses received by substrate at any given point)
 W=width of flashlamp 350 in the conveyance direction [cm]

For example, with a conveyance speed of 100 m/min, an overlap factor of 4, and a curing head width of 7 cm, the pulse rate of the strobe is 95.4 Hz. For faster conveyance speeds, this relationship can be satisfied by increasing the width of flashlamp 450 or adding additional flashlamps.

In order to achieve a uniform cure over a substrate area larger than the area irradiated by flashlamp 350, flashlamp 350 is required to synchronize the delivery of composite light pulses to the conveyance of the substrate. However, if the conveyance speed is so fast that the substrate moves significantly during the delivery of the composite light pulse, then a uniform cure on the substrate is not possible.

In accordance with a preferred embodiment of the present invention, a uniform cure on a moving substrate can be attained over an arbitrarily long distance of thin film stack 340 if thin film stack 340 moves less than 10% of the width of flashlamp 350 in the conveyance direction during the delivery of the composite light pulse. Expressed in equation form:

$$t < 60 \times W/S$$

where
 t=length of the composite pulse [ms]
 W=width of flashlamp 350 in the conveyance direction [cm]
 S=conveyance speed [m/min]

Table II shows maximum pulse length of composite pulse [ms] for uniform curing versus conveyance speed and the width of light pulses in the conveyance direction. The time in milliseconds that composite pulse must be shorter than to attain uniform processing in the conveyance direction.

TABLE II

| | light pulse width | | |
|---|---|---|---|
| speed [m/min] | 7 cm | 14 cm | 28 cm |
| 1 | 420 | 840 | 1,680 |
| 10 | 42 | 84 | 168 |

TABLE II-continued

| | light pulse width | | |
|---|---|---|---|
| speed [m/min] | 7 cm | 14 cm | 28 cm |
| 100 | 4.2 | 8.4 | 16.8 |
| 1,000 | 0.42 | 0.84 | 1.68 |

EXAMPLE 1

Drying and Sintering of Nano-silver Ink on PET

Two samples of nano-silver ink on PET were prepared, each sample being a 1 micron thick of nano-silver thin film printed on a 150 micron thick PET substrate. A first sample was dried in an oven at 150° C. for 5 minutes to drive off solvent and exposed to a single light pulse of 1 ms in duration at 1.6 kW/cm$^2$ at a webspeed of 10 m/min with an overlap factor of 4 depositing 1.6 J/cm$^2$ of energy with each delivery of single light pulse for a total of 6.4 J/cm$^2$ energy deposited onto the substrate to sinter the silver.

Without being dried in the oven, the second sample was exposed to a 1 ms long composite light pulse comprised of 6 different micropulses of differing pulse lengths and delays, and the timing (in μs) of the composite light pulse is shown in Table III.

TABLE III

| Turn on | Turn off |
|---|---|
| 0 | 100 |
| 289 | 374 |
| 439 | 474 |
| 604 | 644 |
| 789 | 829 |
| 999 | 1,037 |

The intensity of the light pulses was increased to 4.7 kW/cm$^2$ so that the total amount of energy deposited was identical to the first sample. The material was processed at a webspeed of 10 m/min with a overlap factor of 4 depositing 1.6 J/cm$^2$ with each light pulse for a total of 6.4×1.6 J/cm$^2$ deposited onto the substrate to dry and sinter the silver in a single pass.

The implication of this type of processing is that more processing can be done with less total energy than a conventional oven. In the case of conventional oven processing, the entire substrate, the air around it, and the conventional oven surrounding the processing zone must be heated to process the thin film.

The thermal response at the thin film as well as the back of the substrate for a single pulse neglecting the enthalpy absorbed by the evaporation of solvents is similar to the curve shown in FIG. 2b. The thermal response from the composite light pulse at the thin film and at the back of the substrate is similar to the curve shown in FIG. 2c. A comparison of the curves from FIGS. 2b and 2c shows that the amount of time the thin film is at an elevated temperature is significantly more from a composite light pulse from a single light pulse. Specifically, the amount of time the thin film spends at about 800° C. (see FIG. 2c) is approximately twice as much as that from a single light pulse (see FIG. 2b). As both cases use the same amount of radiant exposure, this translates into more thermal processing for the same amount of energy deposited. In sum, the same amount of thermal processing can be achieved with less energy.

Note that this has a very different effect than a continuous train of small, rapid light pulses. In that case, the timescale of heating would be larger than the thermal equilibration timescale of the thin film stack and would be similar to being heated by a conventional oven. Thus, the surface would not reach the peak temperatures achieved in the present invention without damaging the thin film stack. Consequently, it would have a lower processing rate over the present invention.

Additionally, the composite light pulse has another significant advantage in thermal processes that evolve gas such has drying or gas-evolving chemical reactions. Since the composite light pulse includes multiple micropulses, the thin film being dried is allowed to "breathe," i.e., release gas, between micropulses. This action prevents the build up of gas in the thin film that would otherwise undergo a cohesive failure due to the rapidly expanding gas.

EXAMPLE 2

Multi-Temperature Zone Processing Accounting for Solvent Evaporation

The tunability of the pulse profile is particularly useful for drying thin films where multiple distinct processes can be performed in a single pass. In short, a thin film that contains solvent cannot be heated as rapidly as one which is already dried. That is, when solvent is in the thin film, a high power will rapidly expand the solvent and "explode" the thin film, resulting in a cohesive failure. Ideally, one desires to first remove the solvent at a lower power until it is removed followed by a higher power exposure to perform additional thermal processing such as sintering. FIG. 2d shows a representative thermal response profile of the film and substrate of example 1 from a composite pulse in which the first portion of the pulse maintains the temperature at the surface of the thin film at about 700° C. for the first 1.2 ms, followed by a higher power exposure in order to maintain the thin film's temperature at 1,000° C. for the remaining 0.5 ms. In this example, the solvent evaporation occurs during the lower power processing zone and the sintering occurs during the higher temperature processing zone. Thus, as opposed to ordinary zone processing in which a material is conveyed in a oven with different regions, or zones, with different temperatures. The present invention allows the same type of processing to be done in time and is thus termed "temporal zone processing."

The same principle can be applied to a thin film containing multiple solvents in which multiple heating zones can be formed to evaporate each solvent in order of decreasing volatility. In the system of Example 1, the pulse profile can be calculated by accounting for the total enthalpy change of the primary solvent components, silver ink pigment and substrate when exposed to 6.4 J/cm$^2$, assuming that the system is perfectly absorptive and no energy is lost to the surrounding environment, it is found that 4.4 J/cm$^2$ is required just to heat and evaporate the solvents. The remaining silver metal heats very quick to approximately 1,000° C. requiring a total enthalpy change of 0.15 J/cm$^2$. During the time between the pulses the energy leaks into the substrate causing it to rise to an estimate 146° C. requiring and enthalpy change of 1.85 J/cm$^2$. The total amount of energy required is approximately 6.4 J/cm$^2$.

EXAMPLE 3

Prevention of Cohesive Failure in a Thin Film by Modulation of Gas Generation

An aqueous copper precursor ink was formulated comprising 10.0% wt. copper (II) oxide, 4.5% wt. copper (II)

acetate in a base containing ethylene glycol and glycerol. Traces were printed onto a 125 micron thick PET sheet using an Epson Stylus C88 ink jet printer. Upon curing with a flashlamp, the copper oxide and copper acetate are reduced by the ethylene glycol and glycerol to form a film of conductive copper metal. The reduction reaction generates a moderate amount of gas.

The printed film was cured using the method and apparatus of the present invention with the following conditions: voltage 250 V, composite light pulse duration=1,050 microseconds, 4 micropulses with a duty cycle of 0.6 (i.e., each micropulse was 175 microsecond long with a delay of 117 µs between pulses), overlap factor=3, web speed=6.4 m/min. The sample yield was 100% with an average sheet resistance of 3.7 Ω/□.

When the identical trace was cured with the same equipment, but with only a single pulse, the gas evolution caused a cohesive failure of the traces resulting in a sample yield of only 64%. The average sheet resistance was 5.2Ω/□. Changing any of the input variables resulted in a less conductive or poorer yield trace.

As has been described, the present invention provides a method for thermally processing a thin film on a moving substrate. The present invention allows the thin film to be at an elevated temperature for a significantly longer period of time than the prior art. This is done using the same amount of radiant energy in the same amount of total time so not damage occurs to the substrate.

While the invention has been particularly shown and described with reference to a preferred embodiment, it will be understood by those skilled in the art that various changes in form and detail may be made therein without departing from the spirit and scope of the invention.

What is claimed is:

1. A method comprising:
    conveying a thin film stack past a flashlamp, wherein said thin film stack includes a thin film located directly on a substrate, wherein said substrate is at least twice thicker than said thin film; and
    irradiating said thin film stack with a modulated light pulse to thermally process said thin film, wherein said modulated light pulse yields a thermal profile having a plurality of temperature peaks at a temperature higher than a maximum working temperature of said substrate, wherein said maximum working temperature is the highest temperature said substrate can handle when heated in an oven without being damaged, wherein said thin film stack has a total thermal equilibration time:

$$\tau = (\sqrt{\tau_1} + \sqrt{\tau_2})^2$$

where and $\tau_1, \tau_2$ are thermal equilibrium time of said thin film and said substrate, respectively, wherein $$\tau_1 = \frac{c_1 \rho_1 x_1^2}{4\kappa_1}$$

where $c_1$=specific heat of said thin film,
    $\rho_1$=mass density of said thin film,
    $x_1$=thickness of said thin>film,
    $\kappa_1$=thermal conductivity of said thin film, and $$\tau_2 = \frac{c_2 \rho_2 x_2^2}{4\kappa_2}$$

where $c_2$ specific heat of said substrate,
    $\rho_2$=mass density of said substrate,
    $x_2$=thickness of said substrate,
    $\kappa_2$=thermal conductivity of said substrate.

2. The method of claim 1, wherein said conveying further includes conveying said thin film stack less than 10% of the length of a irradiating area of said flashlamp in a conveyance direction during the time said modulated light pulse is being delivered.

3. The method of claim 1, wherein a total time duration $t_p$ of said modulated light pulse is shorter than said total thermal equilibration time of said thin film stack.

4. The method of claim 1, wherein said plurality of temperature peaks are at identical temperatures.

5. The method of claim 1, wherein said plurality of temperature peaks are at different temperatures.

6. The method of claim 1, wherein said modulated light pulse is shaped by voltage, pulse length and duty cycle to yield said thermal profile.

7. The method of claim 1, wherein said maximum working temperature of said substrate is less than 450 ° C.

* * * * *